United States Patent [19]
Filipovic et al.

[11] Patent Number: 5,910,752
[45] Date of Patent: Jun. 8, 1999

[54] FREQUENCY DEMODULATOR WITH RESAMPLED OUTPUT

[75] Inventors: Daniel Filipovic, Solana Beach; Saed G. Younis, San Diego, both of Calif.

[73] Assignee: Qualcomm Incorporated, San Diego, Calif.

[21] Appl. No.: 08/987,307

[22] Filed: Dec. 9, 1997

[51] Int. Cl.$^6$ ................................. H03D 3/00; H04B 1/16
[52] U.S. Cl. .................... 329/341; 329/343; 455/214; 455/337
[58] Field of Search ..................... 329/341–343; 455/205, 214, 337; 375/324, 328, 334–337

[56] References Cited

U.S. PATENT DOCUMENTS

| | | | |
|---|---|---|---|
| 4,884,037 | 11/1989 | Sogo | 329/343 X |
| 5,239,273 | 8/1993 | Hedstrom et al. | 329/341 X |

FOREIGN PATENT DOCUMENTS

| | | | |
|---|---|---|---|
| 0173244 | 10/1982 | Japan | 329/343 |
| 0032507 | 2/1989 | Japan | 329/341 |

*Primary Examiner*—David Mis
*Attorney, Agent, or Firm*—Russell B. Miller; Brian S. Edmonston

[57] ABSTRACT

An receiver receives, amplifies, filters, and downconverts an RF signal to obtain an FM signal. The FM signal is then limited by a limiter and sampled by an ADC. The FM samples from the ADC are provided to an edge detector which detects transitions in the FM samples. The transitions correspond to zero crossings in the FM signal. The time period between the zero crossings, or the cycle width, is measured with a counter to determine the instantaneous frequency $f_c$ of the FM signal. The demodulated output is proportional to the instantaneous frequency which can be determined from the measured cycle periods as $f_c = \frac{1}{2}T_c$, $f_c \approx -\alpha T_c$, or $f_c T_c$, where $T_c$ is the measured cycle period, and $\alpha$ is a constant based on the slope of $\frac{1}{2}T_{c,avg}$, where $T_{c,avg}$ is the average cycle period. The sample rate of the demodulated output can be reduced, through resampling, to minimize power consumption in the subsequent signal processing blocks.

12 Claims, 5 Drawing Sheets

FREQUENCY DEMODULATOR WITH RESAMPLED OUTPUT

BACKGROUND OF THE INVENTION

I. Field of the Invention

The present invention relates to communications. More particularly, the present invention relates to a novel and improved FM demodulator.

II. Description of the Related Art

Frequency modulation (FM) is an important modulation scheme used to facilitate transmission information from a transmitter to a receiver. An exemplary application which utilizes FM modulation is a cellular communication system which conforms with the Advanced Mobile Phone System (AMPS) standard. In FM modulation, the frequency of a carrier sinusoid is varied in accordance with a modulating signal which contains the information. The FM signal can be expressed as:

$$y(t)=\cos[2\pi(f_c+A_o m(t))t] \qquad (1)$$

where y(t) is the FM signal, $f_c$ is the frequency of the carrier sinusoid, $A_o$ is the gain which controls the amount of frequency deviation, and m(t) is the modulating signal. FM modulation can be implemented in one of numerous methods. For example, FM modulation can be achieved by providing the control voltage of a voltage controlled oscillator (VCO) with the modulating signal. The frequency modulated signal from the VCO comprises the FM signal which is then conditioned and transmitted to the receiver.

At the receiver, the FM signal can be demodulated in one of numerous methods. For analog FM demodulation, an FM discriminator can be used to convert the frequency modulated FM signal into an amplitude modulated signal which can be detected with an envelop detector. Alternatively, analog FM demodulation can be performed by a phase locked loop (PLL) which locks a VCO within the PLL to the received FM signal. Once the PLL locks to the FM signal, the control voltage to the VCO comprises the estimate of the modulating signal. FM detection using FM discriminator and PLL are commonly used in the art.

The received FM signal can also be demodulated digitally using a quadrature receiver such as the receiver disclosed in U.S. patent application Ser. No. 08/987,308, entitled "RECEIVER WITH SIGMA-DELTA-CONVERTER" filed Dec. 9, 1997, assigned to the assignee of the present invention and incorporated by reference herein. In an exemplary digital FM demodulation scheme, the quadrature I and Q baseband samples from the receiver are provided to an arc-tangent lookup table to convert the baseband samples into phase information. The phase information is then differentiated to produce the demodulated output.

The analog and digital FM demodulation schemes of the prior art require additional circuitry which can increase the complexity of the receiver. The additional circuitry increases cost, reduces reliability, and increases the circuit size and weight. These factors are important considerations for receivers which are produced in high quantity. Furthermore, the additional circuitry consumes power which can decrease the operating time of a receiver used in mobile applications, such as a cellular telephone. A new scheme is needed to perform FM demodulation while reducing circuit complexity and minimizing power consumption.

SUMMARY OF THE INVENTION

The present invention is a novel and improved FM demodulator. In the present invention, the transmitted FM signal is received, amplified, filtered, and downconverted to an intermediate frequency and filtered. The signal is then limited by a hard limiter and sampled by an analog-to-digital converter (ADC). The FM samples from the ADC are provided to an edge detector which detects transitions in the FM samples. The transitions in the FM samples correspond to zero crossings in the FM signal. The time period between the zero crossings, or the cycle width, is measured with a counter to determine the instantaneous frequency of the FM signal. The modulating signal is proportional to the instantaneous frequency and can be determined from measurements of the cycle periods.

It is an object of the present invention to provide noise shaping of the quantization noise due to sampling of the cycle periods by the ADC. In the resent invention, the cycle periods are quantized by the sampling clock. Because the zero crossings, and therefore the cycle periods, do not align with he sampling clock, quantization error (or quantization noise) occurs in the measurements of the cycle periods. In the present invention, the quantization noise is effectively noise shaped with a first order noise shaper by sampling the cycle periods with a continuous sampling clock. Noise shaping improves the performance of the FM demodulator.

It is another object of the present invention to provide a demodulated output which is a function of the measured cycle periods. For FM modulation, the modulating signal is proportional to the instantaneous frequency fc of the carrier sinusoid. The instantaneous frequency of the sinusoid can be calculated as $f_c=\frac{1}{2}T_c$, where $T_c$ is the measured cycle period. However, for small frequency deviation of the sinusoid, $f_c$ can be estimated as $f_c \approx -\alpha T_c$, where $-\alpha$ is a the slope of a line tangent to $f_c=\frac{1}{2}T_c$ at $T_c=T_{c,avg}$, where $T_{c,avg}$ is the average measured cycle period. The approximation for $f_c$ can be further simplified to $f_c T_c$.

It is yet another object of the present invention to minimize power consumption in the FM demodulator. For complementary metal-oxide-semiconductor (CMOS) circuits, the power dissipation is approximately proportional to the frequency of the clock used to switch the CMOS circuits. To minimize power consumption, the sample rate of the demodulated output can be reduced. In the exemplary embodiment, this is performed by resampling the demodulated output with a resampling clock having a lower frequency than the sampling clock. Prior to resampling, anti-aliasing filtering can be performed on the demodulated output to remove spurious signals which can fall into the signal band as the result of resampling as well as the quantization noise from the ADC.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
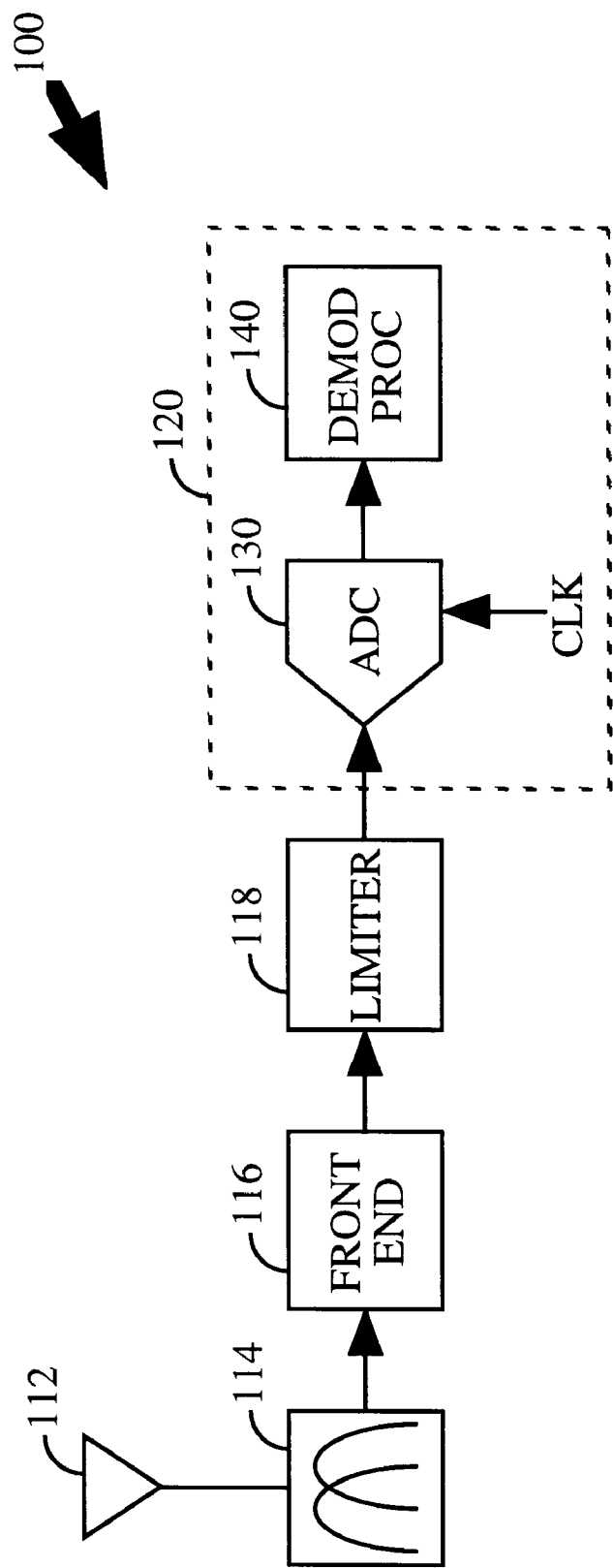
FIG. 1 is an exemplary block diagram of the FM receiver of the present invention.

Referring to the figures, an exemplary block diagram of the FM receiver of the present invention is shown in FIG. 1. The FM signal is received by antenna 112, routed through duplexer 114, and provided to front end 116. Front end 116 amplifies, filters, and downconverts the signal to the FM carrier frequency. An exemplary front end is described in U.S. patent application Ser. No. 08/987,305, entitled "PROGRAMMABLE LINEAR RECEIVER" filed Dec. 9, 1997, assigned to the assignee of the present invention and incorporated by reference herein. Other implementations of front end 116 can be contemplated and are within the scope of the present invention. The signal from front end 116 is provided to limiter 118 which amplifies the signal and limits the signal swing. The implementation of limiter 118 is well known in the art. The limited FM signal is provided to FM demodulator (FM DEMOD) 120. Within FM demodulator 120, the limited FM signal is provided to analog-to-digital-converter (ADC) 130 which samples the limited FM signal with the sampling clock (CLK). In the exemplary embodiment, ADC 130 is a 1-bit ADC which can be implemented with a synchronous comparator. The FM samples from ADC 130 are provided to demodulator processor (DEMOD PROC) 140. In some applications, limiter 118 is not required and the FM signal from front end 116 can be provided directly to FM demodulator 120.

In FM modulation, the frequency of a carrier sinusoid is varied in accordance with a modulating signal which contains the information. Thus, the information is encoded into the instantaneous frequency of the sinusoid. In most applications, the bandwidth of the modulating signal is limited to a small fraction of the frequency of the carrier sinusoid (e.g. small frequency deviation). In this case, the instantaneous frequency of the carrier, and thus the information, can be determined from the zero crossings of the carrier sinusoid. The zero crossings mark the start and finish of a cycle period, which is defined in this specification as the time difference between two consecutive zero crossings and is denoted by $T_c$. The cycle period is related to the instantaneous frequency of the sinusoid. In fact, the instantaneous frequency of the sinusoid, denoted as $f_c$, can be calculated as $f_c = \frac{1}{2}T_c$. By accurate measurements of the cycle periods, the instantaneous frequency of the sinusoid can be determined and the modulating signal can be obtained.

The zero crossings (and thus the cycle periods) of the limited FM signal from limiter 118 can be obtained with accuracy, since the limited FM signal is an analog waveform in continuous time. In the present invention, the cycle periods are sampled by ADC 130 with the sampling clock having a discrete clock cycle width $T_{CLK}$. The cycle periods are sampled to facilitate digital signal processing by the subsequent blocks. However, sampling of the cycle periods with a clock is akin to quantization of the cycle periods using discrete levels. Sampling of the cycle periods results in quantization error because the width of the cycle periods are not an integer number of sampling clock cycles. More specifically, quantization error occurs because the zero crossings do not exactly align with the sampling clock. The quantization error in the sampled cycle periods results in quantization noise in the FM samples which can degrade the performance of the system.

Figure 2A:
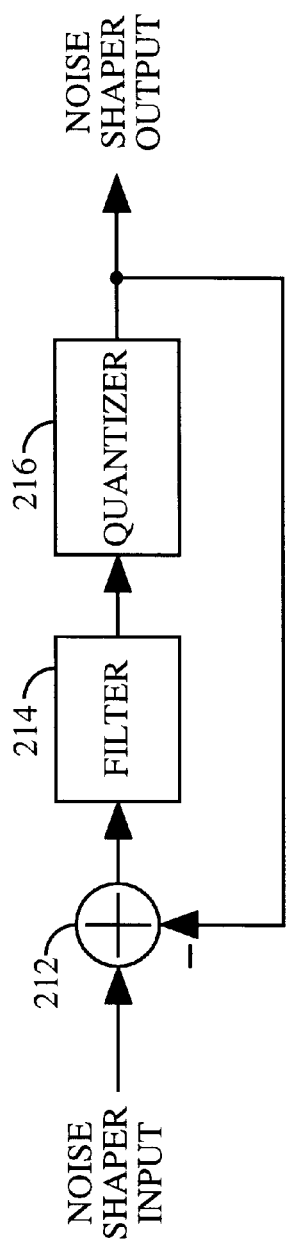
FIG. 2A is a block diagram of an exemplary noise shaper implemented as a sigma-delta modulator.

To improve performance, the quantization noise can be noise shaped, or pushed from the signal band to out-of-band frequency where filtering of the noise can be more easily performed. A block diagram of an exemplary noise shaper implemented as a sigma-delta modulator is illustrated in FIG. 2A. The noise shaper input is provided to summer 212 which also receives the noise shaper output from quantizer 216. Summer 212 subtracts the noise shaper output from the noise shaper input and provides the error to filter 214. Filter 214 shapes the error with the filter transfer function H(s) which determines the noise shaping characteristics of the noise shaper. For a baseband noise shaper, wherein the quantization noise near DC is pushed to higher frequency, filter 214 is a lowpass filter. The output from filter 214 is provided to quantizer 216 which quantizes the filtered signal. The noise shaper output from quantizer 216 comprises the noise shaper input plus the quantization noise which is noise shaped in accordance with the filter transfer function H(s).

Figure 2B:
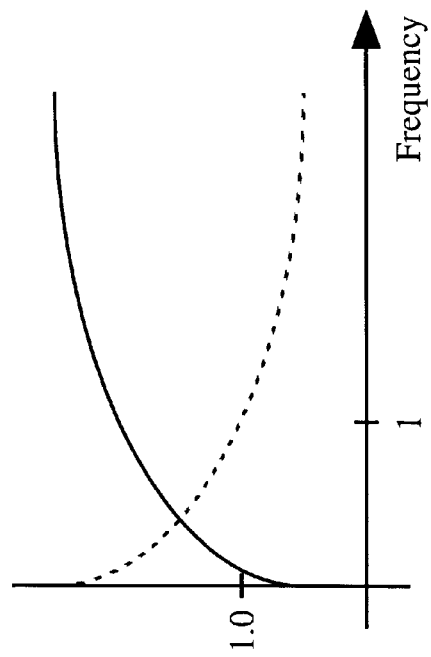
FIG. 2B is a plot of the filter transfer function and the noise transfer function of the noise shaper.

In the exemplary embodiment, filter 214 is a lowpass filter having a filter transfer function of $H(s)=1/s$, which is an integrator. A plot of the filter transfer function $H(s)=1/s$ versus frequency is shown in FIG. 2B by the dashed line. The noise transfer function (NTF) of the quantization noise is shown in FIG. 2B by the solid line. Note that the noise transfer function is the reciprocal of the filter transfer function. Note also that for a baseband noise shaper, the quantization noise near DC is pushed to higher frequency.

Figure 3A:
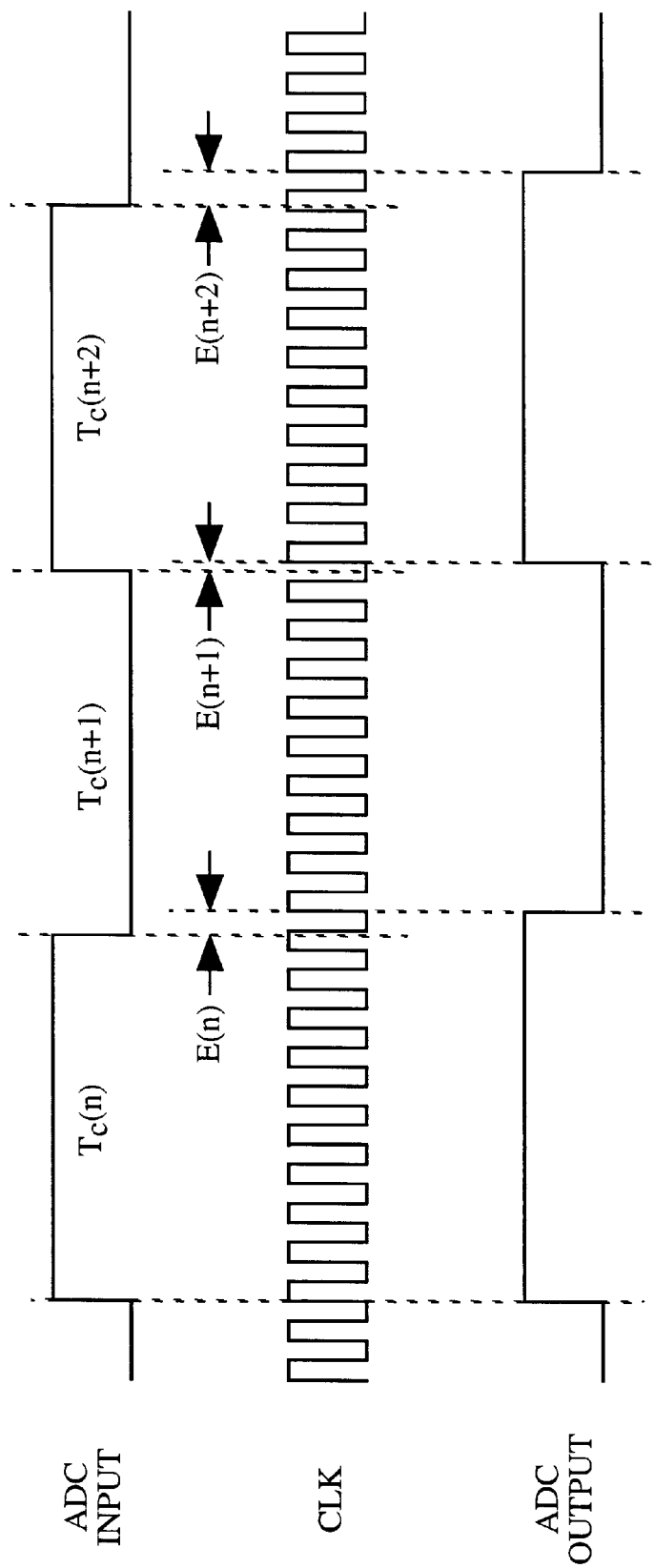
FIG. 3A is a diagram illustrating the sampling of the FM signal by the analog-to-digital converter.

In the present invention, noise shaping of the quantization error in the measured cycle periods is performed by sampling the cycle periods with a continuous sampling clock. Referring to FIG. 3A, in the exemplary embodiment, the limited FM signal into the ADC (e.g. ADC input) is sampled at the leading edge of the sampling clock (CLK). At the end of cycle period $T_c(n)$, a quantization error of E(n) exists between the ADC input and the ADC output because the cycle period $T_c(n)$ is not aligned with the leading edge of the sampling clock. This error results in the cycle period at the ADC output being wider than the cycle period at the ADC input. The error is carried forward to the measurement of the cycle period $T_c(n+1)$, where it results in the cycle period at the ADC output being more narrow than the cycle period at the ADC input. Similarly, the error E(n+1) from cycle period $T_c(n+1)$ is carried forward to the measurement of the cycle period $T_c(n+2)$. In the example shown in FIG. 3A, cycle periods having a width of 9.375 are quantized to cycle periods having widths of 10, 9, 10, 9, 10 and so on such that the average cycle period width is 9.375.

Sampling with a continuous clock is equivalent to a first order noise shaper as shown in FIG. 2A. Since the error E(n) is carried forward to the next measurement, sampling with a continuous clock effectively implements filter 214 as an integrator having a transfer function of 1/s. Assuming that the first edge of the cycle period at the ADC input is aligned with the sampling clock as shown by cycle period $T_c(n)$ in FIG. 3A, sampling results in the cycle period at the ADC output having a wider width than the cycle period at the ADC input. Whenever the accumulated quantization error exceeds one sampling clock cycle, the width of the cycle period at the ADC output is shortened by one sampling clock cycle to reflect the integer portion of the error. The fractional portion of the error is accumulated in the measurement of the next cycle period. Thus, sampling performs the first order noise shaping of the quantization error equivalent to the function performed by the noise shaper shown in FIG. 2A.

The measured cycle period $T_c$ is related to the instantaneous frequency according to $f_c = \frac{1}{2}T_c$. Furthermore, the instantaneous frequency is proportional to the amplitude of the modulating signal m(t). Thus, the amplitude of the modulating signal is proportional to the measured cycle period and can be calculated as m(t) 1/$T_c$. For small frequency deviation, $T_c$ changes little and ½$T_c$ can be approximated as $-\alpha T_c$, where $-\alpha$ is the slope of a line tangent to $f_c$=½$T_c$ at $T_c$=$T_{c,avg}$, where $T_{c,avg}$ is the average measured cycle period. Therefore, m(t) can be approximated as m(t) $-\alpha T_c$ for small frequency deviation. This approximation simplifies the subsequent signal processing by removing the ½$T_c$ operation but introduces an error. For some applications, such as cellular communication system, the error is negligible. The approximation above can be further simplified as $f_c \approx \alpha T_c$, or $f_c$ $T_c$. The use of $f_c$=½$T_c$, $f_c \approx \alpha T_c$, or $f_c$ $T_c$ is within the scope of the present invention.

Figure 3B:
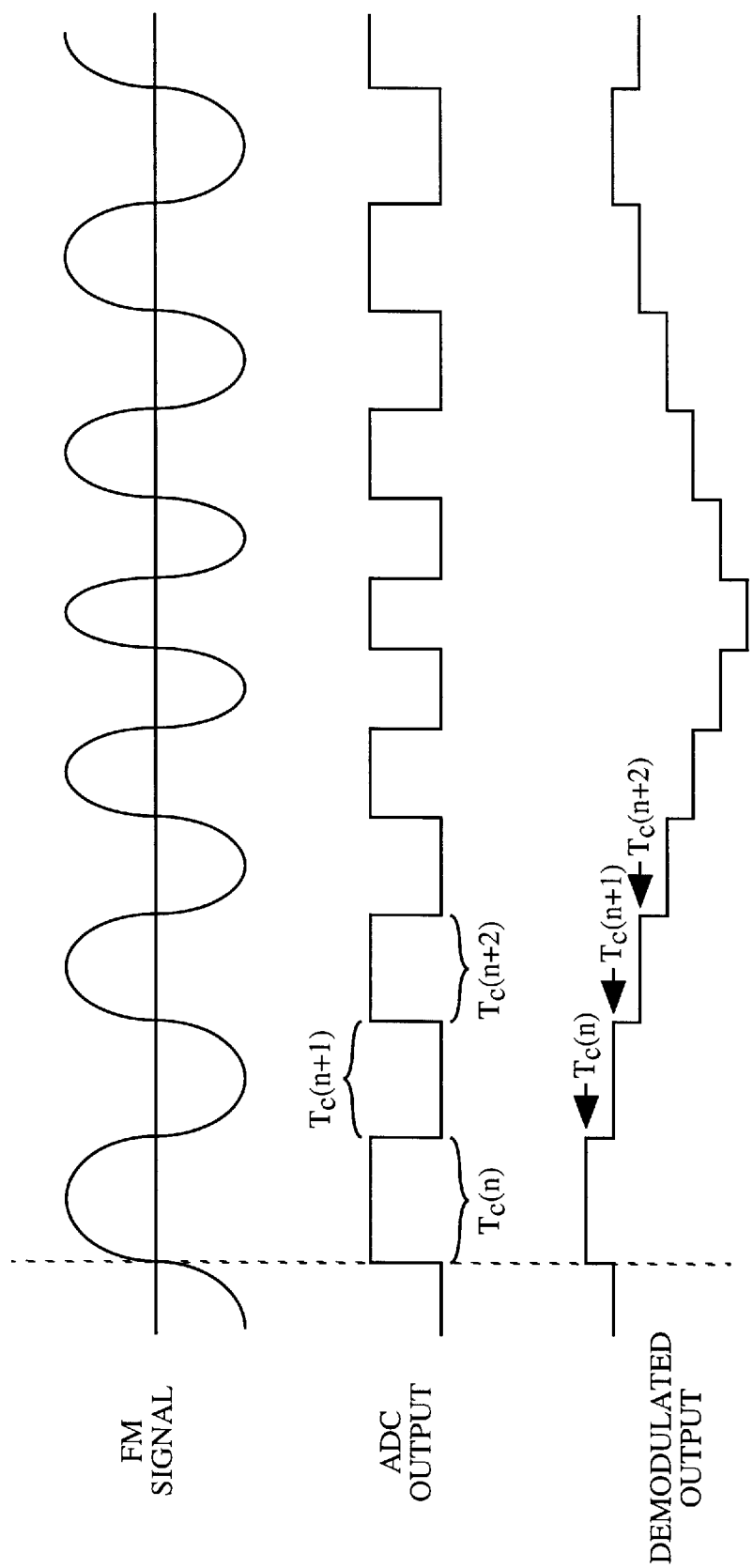
FIG. 3B is a diagram illustrating the FM demodulation of the present invention.

A diagram illustrating the FM demodulation of the present invention is shown in FIG. 3B. The FM signal, as shown in the top graph, is conditioned, limited, and sampled by ADC 130 to produce FM samples (e.g. ADC output) as shown in the middle graph. The width of the cycle periods corresponds to the amplitude of the modulating signal, as described above. In the exemplary embodiment, the approximation of m(t) $T_c$ is used. A counter is used to measure the width of each cycle period. The counter is reset at the start of each cycle period (e.g. by detecting an edge in the FM samples) and counts upward until the next edge is detected. The count value from the counter comprises the demodulated output, which is shown by the lower graph. Note that when the width of the cycle period is wide, the count value is high, and when the width of the cycle period is narrow, the count value is low. Additional digital signal processing can be performed on the demodulated output to improve performance.

In the exemplary cellular communication system, power consumption is an important consideration. For signal processing using complementary metal-oxide-semiconductor (CMOS) circuits, the power consumption of the circuits is proportional to the frequency of the clocks used to switch the CMOS circuits, or P $C \cdot V^2 \cdot f_{CMOS}$ where C is the total capacitance being switched, V is the voltage supply of the CMOS circuits, and $f_{CMOS}$ is the switching frequency of the CMOS circuits. To minimize power consumption, the demodulated output can be resampled by a resampling clock (RCLK) which is lower in frequency than the sampling clock (CLK). Resampling at a lower clock frequency can result in aliasing of spurious signals into the signal band. In some application, anti-alias filtering may be utilized to remove spurious signals before resampling. The use of anti-alias filters before resampling is within the scope of the present invention. In the exemplary embodiment, anti-alias filtering is not performed but the demodulated output is resampled by the resampling clock to produce the resampled output.

In the present invention, the resampled output can be provided to additional signal processing to amplify the signal, filter out quantization noise and spurious signals, and decimate the signal to a required data rate. The filtering can be performed by a finite impulse response (FIR) filter, an infinite impulse response (IIR) filter, a polyphase filter, or other filter structures designed to performed the required filtering function. De-emphasis can also be performed on the demodulated output, the resampled output, or the filtered output to compensate for the pre-emphasis performed at the transmitter. The use of emphasis in FM demodulation is known in the art. In addition, signal expansion can be performed on the resampled output.

I. Exemplary Demodulator Processor

Figure 4:
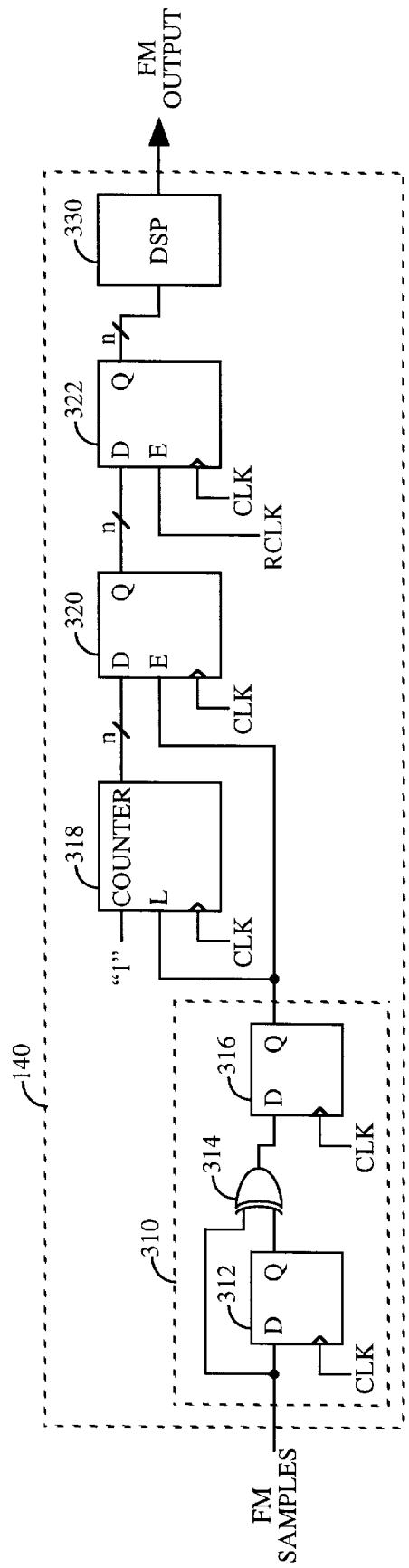
FIG. 4 is a circuit diagram of an exemplary demodulator processor of the present invention.

An exemplary block diagram of demodulator processor 140 is illustrated in FIG. 4. The FM samples are provided to edge detector 310 which outputs a pulse having a width of one sampling clock cycle for each transition in the FM samples. In the preferred embodiments, the FM samples are sampled by two or more D flop-flops (not shown in FIG. 4) before being provided to edge detector 310 to minimize the probability of metastability which can result from sampling an asynchronous signal.

Within edge detector 310, the FM samples are provided to D flip-flop 312 and exclusive-OR gate 314. Flip-flop 312 provides one sampling clock cycle of delay and provides the delayed FM samples to exclusive-OR gate 314. Exclusive-OR gate 314 outputs a one if the two inputs are not the same, indicating that a transition from low to high or high to low in the FM samples has occurred. Alternatively, exclusive-OR gate 314 outputs a zero if the two inputs are the same, indicating that no transition has occurred. The pulses from exclusive-OR gate 314 are provided to D flip-flop 316 which reclocks the pulses with the sampling clock to provide a clean and properly aligned pulse. Flip-flop 312 may be eliminated if the pulses from exclusive-OR gate 314 satisfy the timing and signal integrity requirements. In the exemplary embodiment, within demodulator processor 140, all synchronous circuits, except for digital signal processor 330, are clocked with the sampling clock (CLK).

The pulses from flip-flop 316 mark the zero crossings in the FM signal and are utilized to measure the cycle periods. The pulses are provided to the load input (L) of counter 318. Counter 318 synchronously loads a "one" whenever a pulse is received. Counter 318 then counts upward until the next pulse is received. The pulses are also provided to the enable input (E) of register 320 which loads the value from counter 318 whenever a pulse is received. The value stored in register 320 represents the quantized value of the cycle period which is an estimate of the instantaneous frequency of the FM signal. In the exemplary embodiment, the value in register 320 is resampled by the resampling clock (RCLK) to provide samples at a lower data rate. In the exemplary embodiment, the resampling clock comprises pulses which are high for one cycle of the sampling clock and are spaced m cycles apart. The resampling clock is provided to the enabled input (E) of register 322. When the resampling clock is high, the value in register 320 is loaded into register 322.

Counter 318 and registers 320 and 322 are implemented with n bits, where n is dependent on the maximum width of the cycle periods $T_{c,max}$ and the frequency $F_{CLK}$ of the sampling clock. In the exemplary embodiment, the frequency of the carrier sinusoid is 80 KHz, which corresponds to a maximum cycle period width of approximately 6.25 $\mu$sec, and the frequency of the sampling clock is 19.68 MHz. In the exemplary embodiment, counter 318 and registers 320 and 322 are implemented with eight bits {19.68 MHz/(2·80 KHz)}. In the exemplary embodiment, the frequency of the resampling clock is selected to be ¹⁄₄₁ of the frequency of the sampling clock. This results in samples at 480 KHz being provided to digital signal processor 330. In the exemplary embodiment, resampling by the resampling clock at 480 KHz minimally degrades the performance of FM demodulator 120. The use of resampling at 480 KHz or other resampling frequency is within the scope of the present invention.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. An FM demodulator comprising:

an analog-to-digital converter (ADC) for receiving an FM signal and producing FM samples;

a demodulator processor connected to said ADC for receiving said FM samples and producing FM output, said demodulator processor including:

edge detector, said edge detector receiving said FM samples and producing pulses;

counter, connected to said edge detector, said counter producing a measured cycle period based on said pulses from said edge detector;

first register connected to said counter, said first register producing a demodulated output based on said measured cycle period from said counter;

second register connected to said first register, said second register producing a resampled output based on said demodulated output from said first register.

2. The receiver of claim 1 further comprising:

a limiter connected to said ADC, said limiter receiving said FM signal and producing a limited FM signal; and wherein said ADC receives said limited FM signal and produces FM samples.

3. The receiver of claim 1 wherein said ADC is a 1-bit converter.

4. A method for demodulating an FM signal comprising the steps of:

sampling said FM signals with an analog-to-digital converter (ADC) to produce FM samples;

detecting transmissions in said FM samples;

measuring cycle periods based on said detection of transition in said FM samples;

latching said measured cycle periods to produce a demodulated output;

resampling said demodulated output to produce a resampled output;

calculating an FM output based on said measured cycle periods based on said demodulated output and said resampled output.

5. The method of claim 4 wherein said calculating step comprises the step of:

computing an instantaneous frequency $f_c$ in accordance with a relationship $f_c = \frac{1}{2}T_c$, where $T_c$ is a width of said measured cycle periods; and wherein said calculating step is based on said computed instantaneous frequency.

6. The method of claim 4 wherein said calculating step comprises the step of:

computing an instantaneous frequency $f_c$ in accordance with a relationship $f_c \approx -\alpha T_c$, where $T_c$ is the measured cycle period, $\alpha$ is a constant based on a slope of $f_c = \frac{1}{2}T_{c,avg}$, where $T_{c,avg}$ is an average width of said measured cycle periods; and wherein said calculating step is based on said computed instantaneous frequency.

7. The method of claim 4 wherein said calculating step comprises the step of:

computing an instantaneous frequency $f_c$ in accordance with a relationship $f_c \ T_c$, where $T_c$ is a width of said measured cycle period; and wherein said calculating step is based on said computed instantaneous frequency.

8. The method of claim 4 further comprising the step of:

filtering said demodulated output to produce a filtered output; and wherein said calculating step is based on said filtered output.

9. The method of claim 4 wherein said FM samples are 1-bit samples.

10. The method of claim 9 wherein said FM signal comprises a modulated carrier sinusoid having a carrier frequency of 80 KHz.

11. The method of claim 10 wherein said ADC is clocked with a 19.68 MHz sampling clock.

12. The method of claim 11 wherein said resampling step is performed with a resampling clock having a frequency which is 1/41 of said sampling clock.

* * * * *